(12) United States Patent
Cripe

(10) Patent No.: US 7,714,649 B1
(45) Date of Patent: May 11, 2010

(54) HIGH-EFFICIENCY LINEAR AMPLIFIER USING NON LINEAR CIRCUITS

(75) Inventor: David W. Cripe, Mount Vernon, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 52 days.

(21) Appl. No.: 12/156,479

(22) Filed: Jun. 2, 2008

(51) Int. Cl.
*H03F 3/217* (2006.01)
(52) U.S. Cl. .................................. 330/251; 330/207 A
(58) Field of Classification Search .................. 330/10, 330/251, 207 A
See application file for complete search history.

(56) References Cited

U.S. PATENT DOCUMENTS

| | | | |
|---|---|---|---|
| 2,269,518 A | 1/1942 | Chireix et al. | |
| 3,643,161 A | 2/1972 | Swanson | |
| 3,919,656 A | 11/1975 | Sokal et al. | |
| 5,327,337 A | 7/1994 | Cripe | |
| 5,420,537 A | * | 5/1995 | Weedon et al. ............... 330/251 |
| 7,092,691 B2 | * | 8/2006 | Bohn et al. .................. 455/280 |

* cited by examiner

*Primary Examiner*—Robert Pascal
*Assistant Examiner*—Khiem D Nguyen
(74) *Attorney, Agent, or Firm*—Matthew J. Evans; Daniel M. Barbieri

(57) ABSTRACT

A high-efficiency linear amplifier using non linear circuits. The examples describe of a high-efficiency linear amplifier using non linear circuits ("high-efficiency LINC PA") that can allow linear (typical of less efficient amplifier modes) amplitude modulation ("AM") while operating in a high efficiency quasi-Class-E mode. The exemplary quasi class-E amplifier may be classified as being a type of linear amplifier using nonlinear circuits ("LINC"). This LINC circuit typically combines a quasi-class-E power amplifier with bi-directional power switch parallel coupling at least one capacitor within the power amplifier output network. Complementary phase modulation of the drive signals coupled to the power amplifier and a power switch circuit results in an amplitude modulation of the RF output envelope.

8 Claims, 7 Drawing Sheets

Class-E LINC Power Amplifier

Single Ended Class-E Power Amplifier

Class-E Power Amplifier Waveforms

Push-Pull Class-E Power Amplifier

Class-E LINC Power Amplifier

Circuit Waveforms with −90 degree drive phase shift Producing a typically Maximum output current Circuit Waveforms with 180 degree drive phase shift Circuit Waveforms with 90 degree drive phase shift.

HIGH-EFFICIENCY LINEAR AMPLIFIER USING NON LINEAR CIRCUITS

TECHNICAL FIELD

This description relates generally to amplifiers and more specifically to highly efficient power amplifiers.

BACKGROUND

Generally, an amplifier is an electronic circuit that generally increases, the strength of a signal. A measure of the amplification level often used is gain. Gain is typically measured in decibels ("dB"). Acceptable input ranges for an amplifier may include a range of signal levels to be amplified, and a range of frequencies to be amplified. Signals outside of the specified ranges may not be satisfactorily amplified.

Amplifying a signal can introduce distortion, and various figures of merit can be used to specify acceptable distortion levels in an amplifier. Amplifiers typically convert DC power to a replica of a signal applied to the amplifier. How efficiently this may be done typically depends upon amplifier bias that can place the quiescent operating point of the amplifier circuitry (typically one or more transistors) in various operating regions that typically trade off increasing distortion for increased efficiency.

Efficiency of an amplifier may be divided into classes. Class A amplifiers typically provide a faithful reproduction of the input but are typically inefficient, in the range of 10-20% with a theoretical maximum efficiency of 50%. Class B amplifiers have a better efficiency but are limited in application compared to Class A amplifiers because of higher distortion, such as crossover distortion. In practical audio power amplifier design, class AB designs are often used. Modern Class AB amps are commonly between 35-55% efficient with a theoretical maximum of 78.5%. Class C amplifiers are often used in transmitters to amplify radio signals. Class D switching amplifiers can have efficiencies above 95%. Class D amplifiers are operated with their active devices in on/off switching mode, reducing device dissipation by minimizing the time per RF cycle when both voltage and current are present in the device. Class D amplifiers typically produce an output waveform that converts an input waveform into a pulse-width modulated (square wave) analog signal with an amplitude equal to the supply voltage. The class E and class F amplifiers are highly efficient switching power amplifiers, typically used at such high frequencies that the switching time becomes appreciable compared to the duty time. Other classes of amplifiers are possible, as designers seek to improve amplifier performance, while seeking to reduce the resources needed by amplifiers to produce the improved performance.

Even though higher classes of amplifiers cannot generally be applied for linear amplification, these highly efficient amplifiers typically run much cooler (typically not needing cooling fans and the like to help remove heat) even in high power designs. Thus, high efficiency designs may be sought to be employed in designs where constant envelope signals are generated so that efficient use of power supplies and simplified heat exchanger designs may be utilized.

In popular use, the term amplifier today usually refers to an electronic amplifier, often as in audio applications or the like. A power amplifier ("PA") typically increases voltage and current of an input signal.

SUMMARY

The following presents a simplified summary of the disclosure in order to provide a basic understanding to the reader. This summary is not an extensive overview of the disclosure and it does not identify key/critical elements of the invention or delineate the scope of the invention. Its sole purpose is to present some concepts disclosed herein in a simplified form as a prelude to the more detailed description that is presented later.

The present example provides a power amplifier circuit that can allow linear amplitude modulation while operating in a highly efficient quasi-Class-E mode. The exemplary amplifier may be termed linear amplification using nonlinear circuits ("LINC"). The LINC circuit combines a Class-E power amplifier with a load-modulated output network containing bi-directional synchronous rectifier paralleling two capacitors. Complementary phase modulation of the drive signals of the power amplifier and the synchronous rectifier circuit results in an amplitude modulation of the RF output envelope.

Many of the attendant features will be more readily appreciated as the same becomes better understood by reference to the following detailed description considered in connection with the accompanying drawings.

DESCRIPTION OF THE DRAWINGS

The present description will be better understood from the following detailed description read in light of the accompanying drawings, wherein.

Like reference numerals are used to designate like parts in the accompanying drawings.

DETAILED DESCRIPTION

Figure 1:
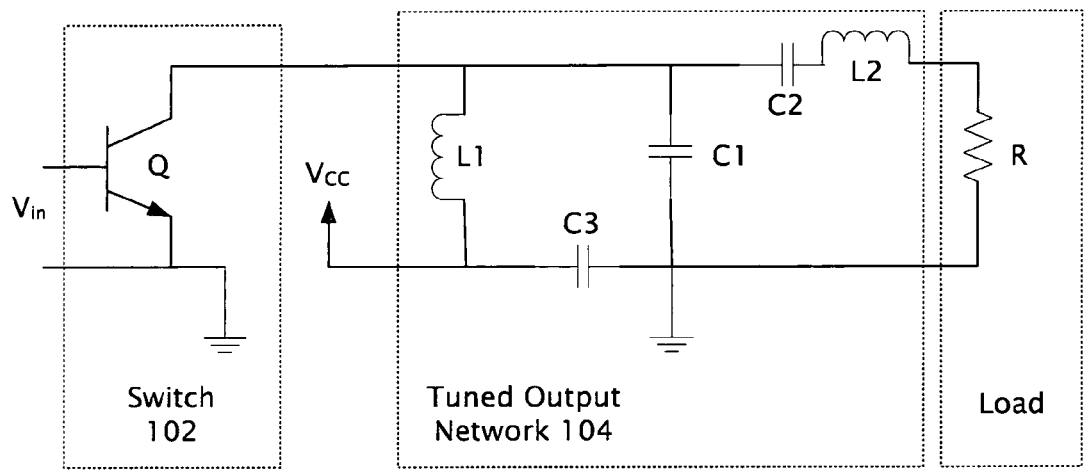
FIG. 1 is schematic of a first example of a class E power amplifier in a single ended configuration.

The detailed description provided below in connection with the appended drawings is intended as a description of the present examples and is not intended to represent the only forms in which the present example may be constructed or utilized. The description sets forth the functions of the example and the sequence of steps for constructing and operating the example. However, the same or equivalent functions and sequences may be accomplished by different examples.

The examples below describe a highly-efficient linear amplification using non linear power amplifier ("high-efficiency LINC PA") circuitry containing a power amplifier capable of operating in a highly-efficient quasi-Class E mode utilizing load modulation to vary the circuit output power. Although the present examples are described and illustrated herein as being implemented in a communications system, the system described is provided as an example and not a limitation. As those skilled in the art will appreciate, the present examples are suitable for application in a variety of different types of signal amplification systems, including audio amplifiers and the like.

To generate high modulation-bandwidth linear RF power amplification, linear amplification using nonlinear circuits ("LINC") technology may be used where high power amplification efficiency is desired. LINC stands for linear amplification using nonlinear circuits. This technique utilizes multiple independent saturating power amplifier modules combined to sum their respective output waveforms to create a phase and amplitude modulated composite signal. Prior LINC systems commonly utilized hybrid combiners, allowing individual amplifier modules to operate at optimal VSWR and efficiency, while wasting considerable power in the combiner dump load.

The examples describe of a highly-efficient linear amplifier using non linear circuits ("high-efficiency LINC PA") that can allow linear (typical of less efficient amplifier modes) amplitude modulation ("AM") while operating in a highly efficient quasi-Class-E mode. The exemplary quasi class-E amplifier may be classified as being a type of linear amplifier using nonlinear circuits ("LINC"). This LINC circuit typically combines a quasi-class-E power amplifier with bi-directional synchronous rectifier parallel coupling at least two capacitors within the power amplifier output network. Complementary phase modulation of the drive signals coupled to the power amplifier and a synchronous rectifier circuit results in an amplitude modulation of the RF output envelope.

In radio frequency power amplifier design, it may be desired to have a high DC to RF conversion efficiency in the power amplifier stage. The benefits of high conversion efficiency may be lowered thermal stresses in the power amplifier devices (transistors), resulting in improved reliability and reduced cooling of these devices. Additionally, a lesser number of power amplifier devices may be needed to generate a given amount of RF power, resulting in lower cost and lower complexity for a power amplifier system. The high-efficiency LINC PA typically provides these functions.

To attain high conversion efficiency, previous power amplifier circuits have been devised in which the amplifier devices are saturated during some portion of each RF cycle. These power amplifiers are referred to as saturating, or switching power amplifiers, with modes of operation referred to as Class-C, Class-D, Class-E, etc.

In particular, Class-E power amplifier circuits have seen application in frequencies through VHF due to their typically negligible (frequency proportional) switching losses, which tend to result in high conversion efficiency, usually exceeding 90%. However, because the power amplifier devices are operated as switches rather than linear devices, the power amplitude of these circuits is directly proportional to the DC supply voltage. The exemplary single ended Class-E power amplifier of FIG. 1, combines a switching power device 102 coupled to a tuned output network 104 to shape the drain voltage and current waveforms to fulfill a specific set of conditions resulting in high operating efficiency.

An exemplary single ended class-E amplifier is further described in U.S. Pat. No. 3,919,656, filed Nov. 11, 1975, the contents of which are incorporated herein by reference. An exemplary push-pull class-E amplifier is further described in U.S. Pat. No. 5,327,337, filed Jul. 5, 1994, the contents of which are incorporated herein by reference.

Figure 2:
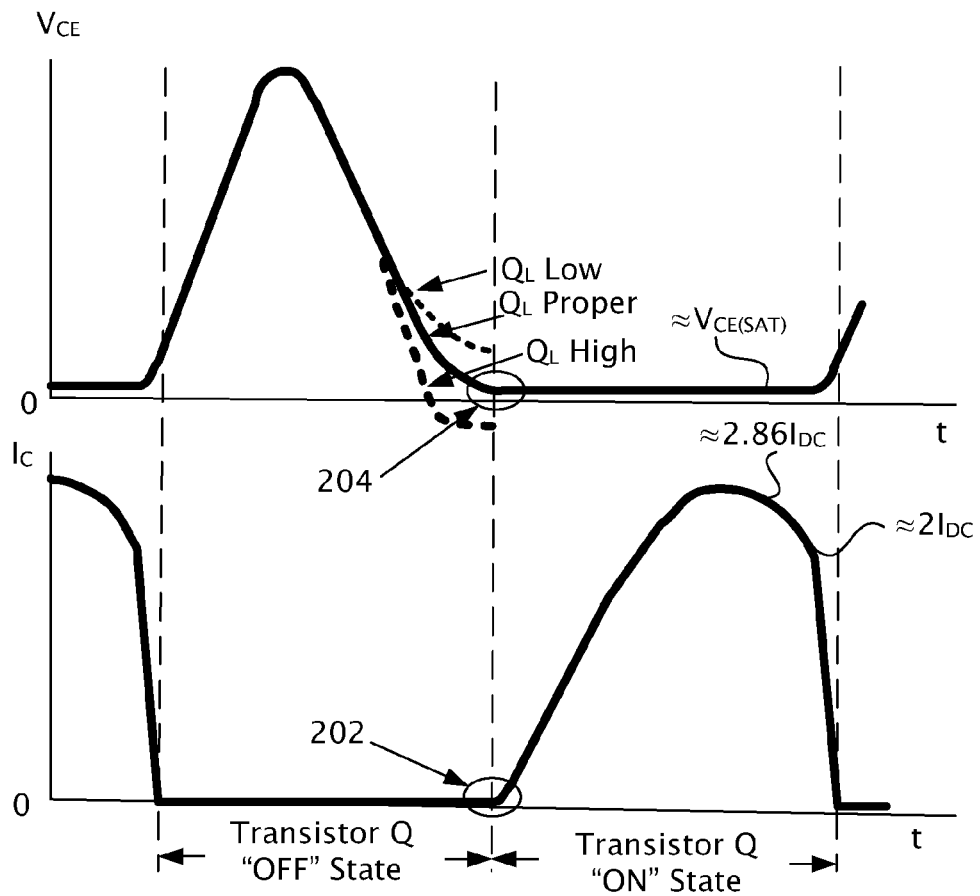
FIG. 2 is a plot showing collector current, and voltage across the collector and emitter of transistor Q of FIG. 1.

As shown in FIG. 2 in the ideal operating condition, at the moment the power device transitions from its non-conducting to conducting state 202, the voltage across the power device should be nominally zero 204. Were this voltage not zero at the moment of switching to the conductive state, the energy stored in the intrinsic capacitance of the semiconductor device, and any paralleled capacitance external to the device, would be discharged into the power device. Repeated once per RF cycle, this energy dissipation could easily surpass the $I^2R$ conduction losses of the device. Maintaining a condition of zero-voltage-switching typically results in minimal switching losses, allowing the efficient operation of the power device at higher frequencies than would otherwise be attainable in other classes of operation.

In radio frequency power amplifier design, it may be desirable to have a system with the ability to modulate the amplitude of the output RF waveform independently of the DC supply voltage. This can be performed through the use of conventional linear power amplifier circuits, such as those operating in Class-A, Class-AB or Class-B. However, because these power amplifier devices operate in their linear mode, the conversion efficiency of the circuits is quite low, typically 50% or lower. More highly efficient amplifiers may be employed in an attempt to modulate the output RF waveform independently of the DC supply voltage. However, these may not be the best choice for linearity.

Efficient amplitude-modulated RF power amplifier systems have been implemented using switching RF power amplifiers, operating Class-D or Class-E, preceded by a Class-S, PWM switching amplifier, providing a modulated supply voltage to the RF power amplifier. Such schemes can yield high conversion efficiency, but tend to be overly complex, and limited in the modulation bandwidth due to the requisite low-pass filter network in the PWM circuit. An exemplary amplifier system with the ability to modulate the amplitude of the output RF waveform independently of the DC supply voltage is further described in U.S. Pat. No. 3,643,161, filed Feb. 15, 1972, the contents of which are incorporated herein by reference.

In alternative examples it may be sought to attain amplitude modulation of a switching RF power amplifier without a separate circuit for modulation of its supply voltage, while maintaining high conversion efficiency, without introducing significant additional complexity to the system.

Techniques of load modulation applied to a switching power amplifier have been devised as a means of attaining both highly efficient power amplification and relative electrical simplicity. An exemplary amplifier system with the ability to modulate the amplitude of the output RF waveform independently of the DC supply voltage is further described in U.S. Pat. No. 7,202,734, filed Jul. 6, 2000, the contents of which are incorporated herein by reference. In this system, a variable capacitance diode (varactor) is provided in the output network of a power amplifier to control the output amplitude of a switching power amplifier.

The power-combination of non-linear, saturating power amplifiers may be called LINC, or Linear amplification with Nonlinear Circuits. This term can refer to any number of exemplary circuits combining saturating power amplifiers in a manner to permit amplitude modulation in a manner more efficiently than with linear amplifiers. LINC power amplifiers will generally also have a bandwidth higher than can typically be attained with a separate envelope power modulator.

A scheme that has been pursued in implementing a LINC power amplifier is that of outphasing. Saturating, or switching power amplifier circuitry is subdivided into two identical, parallel sections. These sections operate at a common frequency, but are phase modulated in a manner complimentary to each other. The voltage outputs of the two power amplifier sections are summed, yielding full output amplitude when the phase difference between the sections is zero, and yielding zero output amplitude when the phase difference between the sections is 180 degrees. While this scheme yields a system that is relatively simple, the conversion efficiency of this system is typically inferior to conventional power amplifiers. An exemplary LINC power amplifier using outphasing is further described in U.S. Pat. No. 2,269,518, filed Jan. 13, 1942, the contents of which are incorporated herein by reference.

The high-efficiency LINC PA may be an improvement on the designs discussed above. Improvement may be provided by utilizing an amplifier ran in quasi-class-E mode to construct an example of a high efficiency LINC PA. Class-E power amplifiers have been constructed using outphasing modulation as described above, but to maintain the proper tuning of the respective output networks, a lossy hybrid combiner has been used to sum the power amplifier outputs.

The term 'Class-E' describes a type of power amplifier in which the active device is operated as a switch having a nominal fifty-percent duty, and the output network comprises a resonant circuit that typically causes the amplifier waveform to minimize the switching losses that would occur during the cyclical turn-on and turn-off of the switch. In particular, Class-E power amplifiers may be tuned so that at the instant prior to the turn-on of the switching device, the voltage supported by the device is nominally zero, and at the instant following the turn-on of the switching device, the current conducted by the device is zero.

Figure 3:
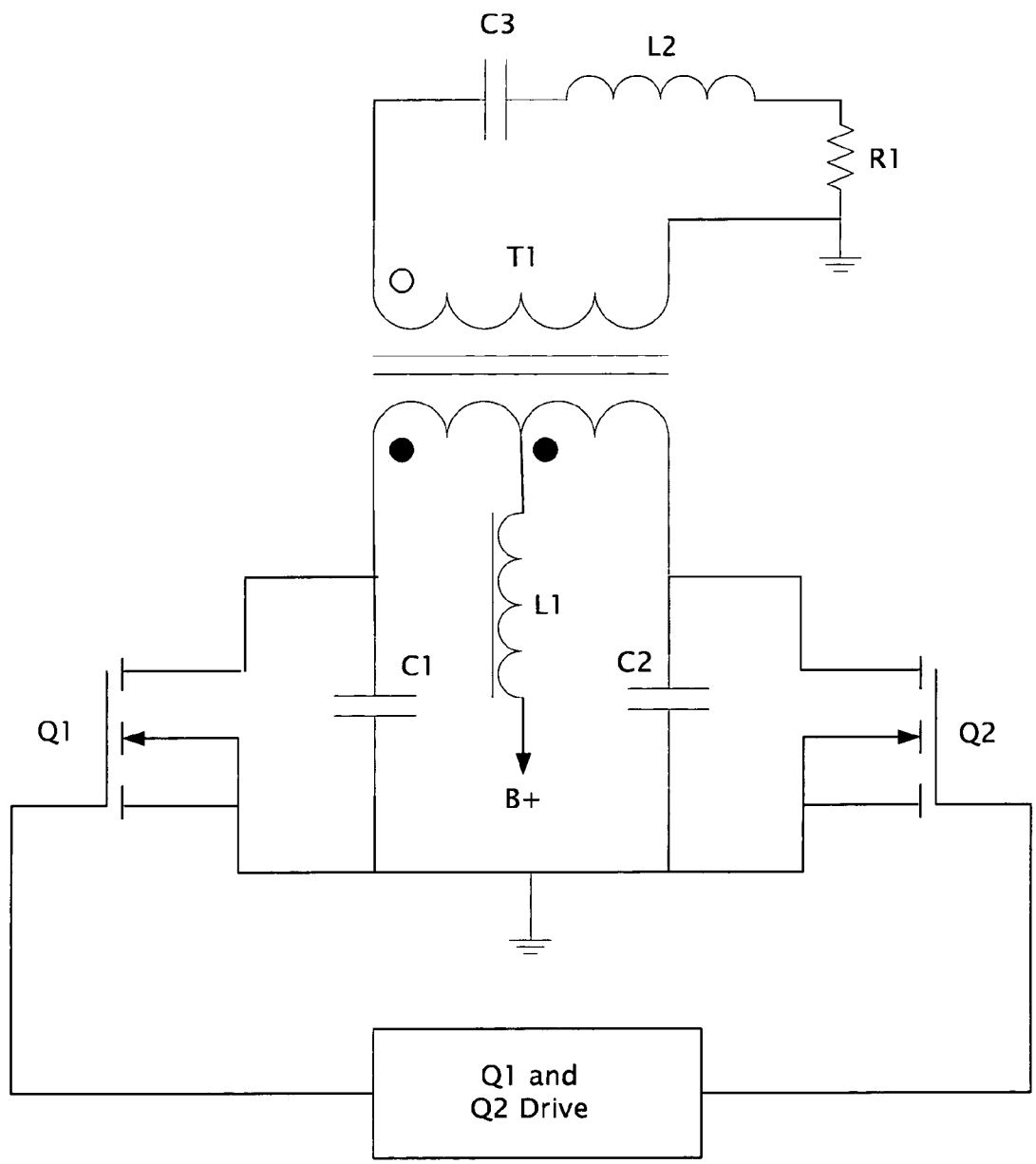
FIG. 3 is schematic of a second example of a Class E power amplifier in a push pull, or balanced configuration.

FIG. 3 is schematic of a third example of a Class E power amplifier in a push pull configuration. The Class-E power amplifier, whether utilizing a single device (active device, transistor, or equivalent), (100 of FIG. 1), or as a push-pull circuit, (300 of FIG. 3), can include switching devices shunted by a capacitive reactance, and an output network containing an inductive reactance of roughly the same magnitude as the resistive component of the RF load. There are typically a specific set of values for these reactive components for each combination of operating frequency, supply voltage, and output power that permit operation in the aforementioned conditions describing a Class-E power amplifier.

The specific set of waveform conditions that can define Class-E operation are as follows:

1. The switch drain-source voltage should be nominally zero at the instant prior to the commencement of switch conduction per each RF cycle.

2. The duty cycle of switch conduction is nominally 50%.

3. The time rate-of-change (slope) of the switch drain-source voltage should be nominally zero at the instant prior to the commencement of switch conduction per each RF cycle.

The use of MOSFET devices in a Class-E power amplifier can allow a special case of operation, quasi-class-E operation. In quasi-class-E operation the output network is intentionally mistuned, or mismatched. If the output network is mistuned in such a manner so that the drain voltage waveform drops below zero during the period of the RF cycle in which the MOSFET is not driven into conduction, the intrinsic 'body diode' of the MOSFET (effectively shunting the drain and source terminals) will typically be biased into conduction, clamping the drain-source voltage so that there will be minimal switching losses at the initiation of the conduction period of the MOSFET. Consequently, a MOSFET-based Class-E power amplifier can be operated efficiently into a broader range of load conditions than the 'classical' class-E circuit with the tuned output network, described by Sokal (U.S. Pat. No. 3,919,656). Provided that conditions 1 and 2 of the above constraints are met, the power amplifier operates in a 'quasi-Class-E' mode, wherein the operation of the power amplifier is not optimal (due to the mistuned output network), yet switching losses of the device still remain nominally zero.

A quasi-class-E power amplifier utilizing MOSFETs as switching devices can tolerate certain specific conditions of load mismatch (in this case due to the mistuned output network). If the resistive component of the load network is reduced from nominal, the switch waveforms can be shifted so that the switch voltage drops below zero in the period immediately prior switch turn-on. This can forward-bias the body diode of the MOSFET switch, and permits current to flow in the reverse direction through the switching device, while still maintaining a condition of zero-voltage switching. Even if the load resistance is reduced to zero, though the output power of the amplifier is reduced to zero, the switching device can maintain a state of zero switching losses, with no significant increase in conduction losses.

Consequently, there are conditions of load mismatch for the quasi-class-E power amplifier that can result in conditions of minimal stress for the switching device. These loads can be defined by a line in the complex plane connecting R, the ideal load resistance, with an inductive reactance having a complex impedance of nominally jR. If the load impedance of the quasi-class-E power amplifier is continuously varied along this line, its power can be controlled linearly to zero while it switching waveforms will remain in optimal quasi-Class-E operation.

Figure 4:
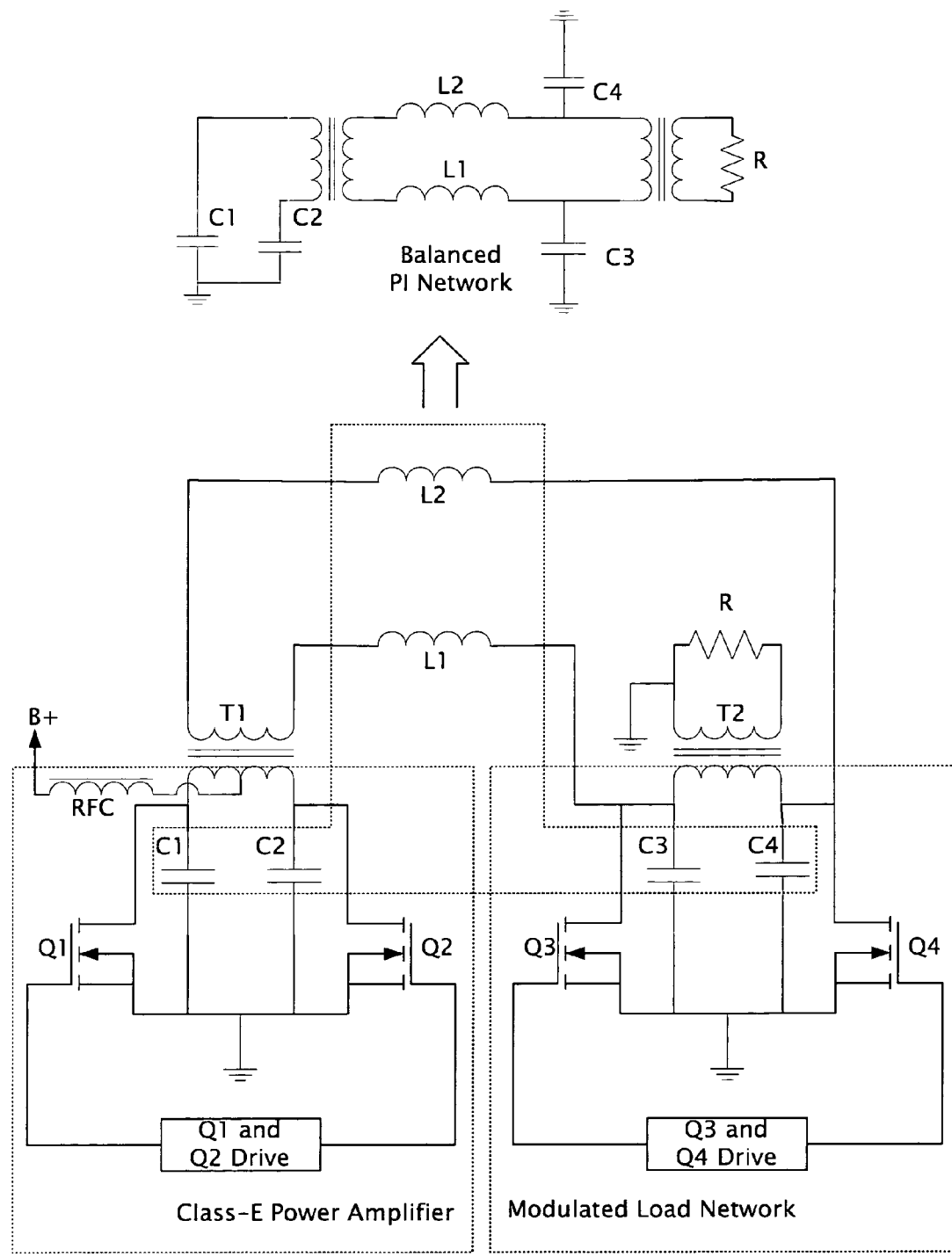
FIG. 4 is a schematic of an example of the high-efficiency LINC PA using a quasi-class-C operating amplifier.

FIG. 4 is a schematic of an example of the high-efficiency LINC PA using a quasi-class-E operating amplifier. The circuit can include a conventional quasi-class-E power amplifier having switched conventional MOSFET transistors Q1 and Q2, followed by a modulated load network containing conventionally constructed MOSFET transistors Q3 and Q4. Although enhancement mode MOSFETs are shown for Q1-Q4, depletion mode MOSFETs, MESFETs or bipolar transistors may equivalently be substituted. Both switch pairs Q1-Q2 and Q3-Q4 are driven in push-pull at nominally 50% duty cycle, while the relative phase of drive signals between Q1-Q2 and Q3-Q4 are varied per the desired power amplifier output. Each switch transistor possesses an associated capacitance included in transistors Q1 through Q4, which is comprised partially or entirely of the parasitic drain-source capacitance of each transistor. In alternative examples one or more trimming capacitors may be coupled from drain to source.

DC power from a conventionally constructed, fixed-voltage power supply, may be coupled to the power amplifier through a conventionally constructed RF choke RFC, into the primary center tap of conventionally constructed transformer T1. The secondary of the transformer T1 is connected to conventionally constructed inductors L1 and L2, which in turn connect to drain terminals of switch transistors Q3 and Q4. Transistors Q3 and Q4 are in turn shunted by conventionally constructed capacitors C3 and C4. Capacitors C1 and C3 are also conventionally constructed. The network consisting of C1, C2, L1, L2 C3 and C4 comprised a balanced Pi network. A conventionally constructed balun transformer T2 connects the drains of Q3 and Q4. The secondary of transformer T2 can be coupled to a load network constructed to provide a nominally resistive impedance at a carrier frequency of operation, and preferably a comparatively large impedance to all harmonics. The nominally real load can be 50 ohms, however in alternative embodiments other nominally real load impedances may be designed for, such as 25 ohms and the like. In further alternative examples the output may be configured to be balanced rather than the single ended configuration shown.

During operation, if the phase of the transistor switches Q3-Q4 is −90 degrees with respect to the drive signals coupled to Q1-Q2, the switch conduction overlaps the inductor current in such a way that there is substantially no body diode conduction occurring within Q3 and Q4, and the resonant drain-source voltage will exhibit its maximum amplitude. If the relative switch drive signal phase angle is retarded, the switches Q3 and Q4 will exhibit body diode conduction in the interval prior to switch activation. This has the net effect of having a periodic short circuit placed across the primary of transformer T2, which works against the impedance of L1 and L2 to attenuate the differential Q3-Q4 drain voltage signals, effectively reducing the amplitude of the output signal. However, the drain voltage and switch current waveforms still remain in the low-loss quasi-Class-E mode.

Minimum voltage output occurs when the relative switch drive phase is retarded by a nominal 90 degrees. An intermediate voltage output occurs when the relative switch drive phase is retarded by a nominal 180 degrees.

Figure 5:
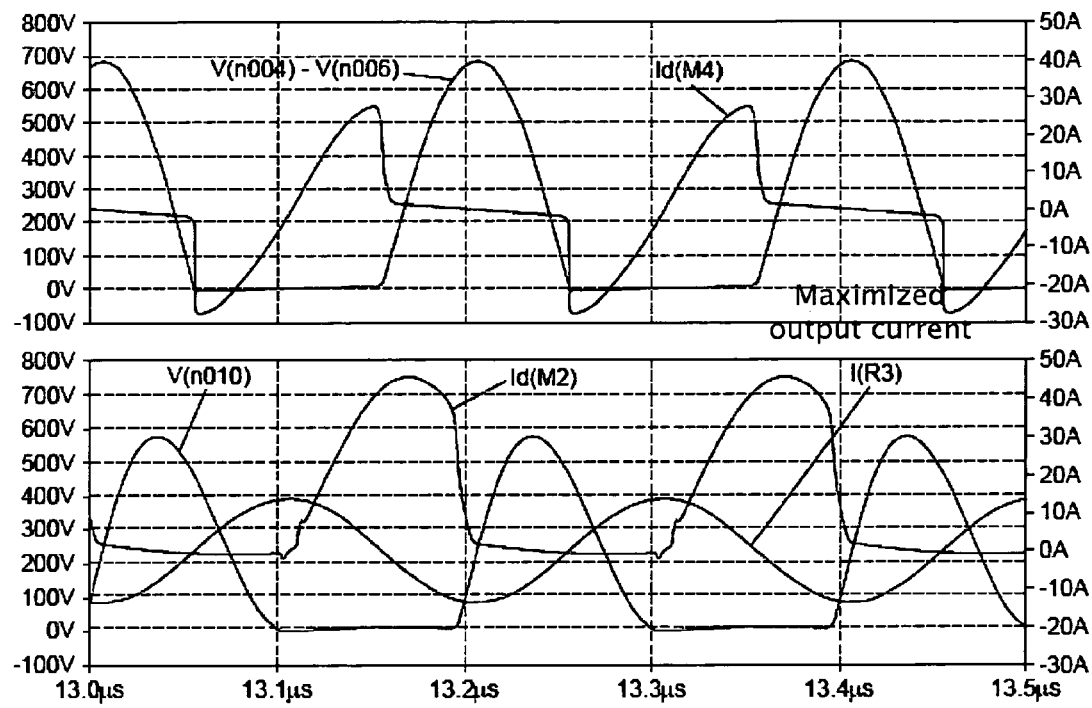
FIGS. 5-7 are examples of SPICE simulations of the high-efficiency LINC PA using a quasi-class-E operating amplifier circuit constructed as described above and showing the effects of varying drive phase away from −90 degrees, 180 degrees, and 90 degrees.
Figure 6:
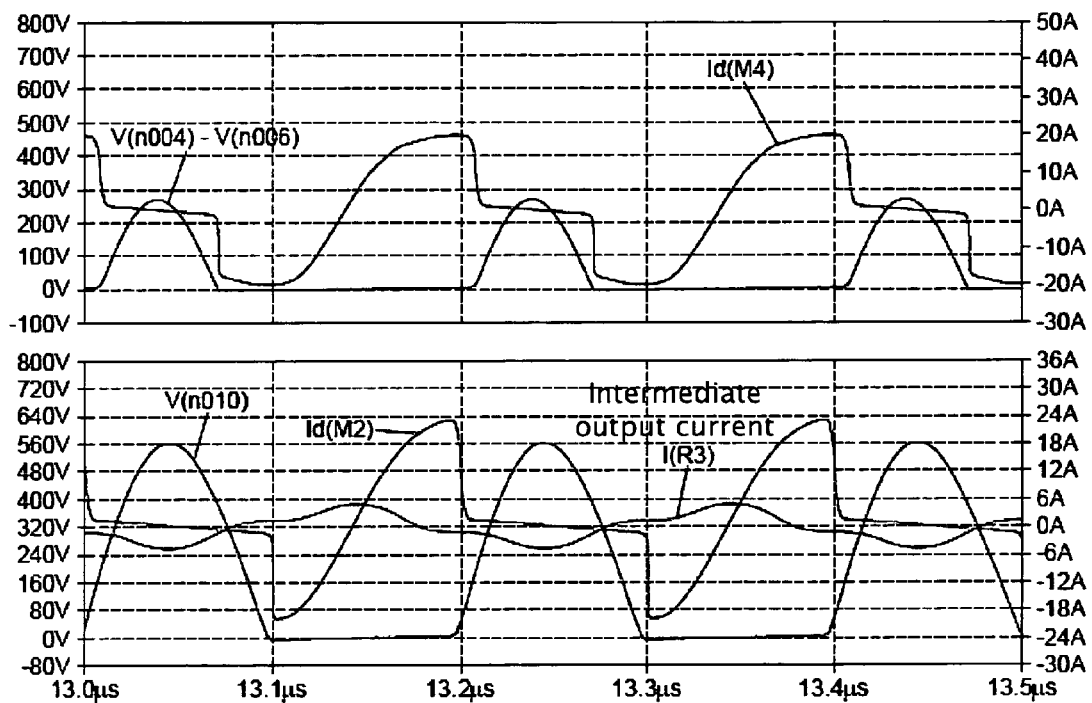
Figure 7:
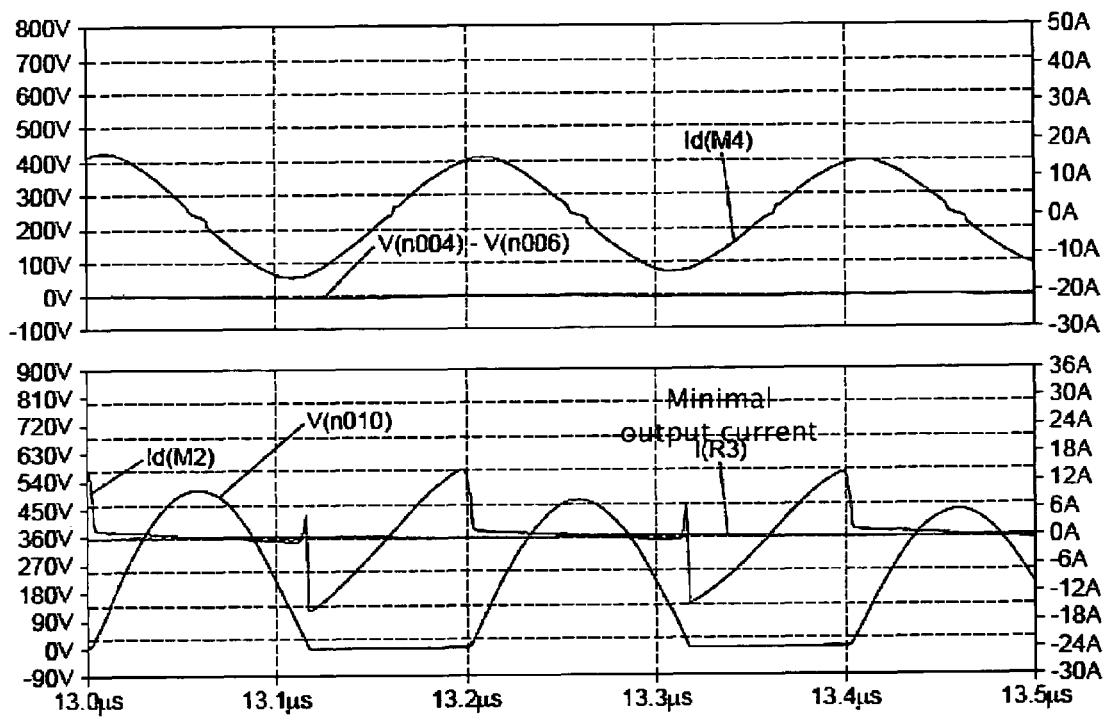

FIGS. 5-7 are examples of SPICE simulations of the high-efficiency LINC PA using a quasi-class-C operating amplifier circuit constructed as described above and showing the effects of varying drive phase away from −90 degrees. FIGS. 5-7 depict simulations for relative drive phase angles of −90, 180 and 90 degrees, respectively. The exemplary circuit operates from a 177 volt power supply (B), has a carrier frequency (f) of 5 MHz, and is coupled to a conventional 50 ohm load. The trace labeled V(n010) depicts drains-source voltage of Q2, and the trace labeled Id(M2) depicts the drain current of Q2. The trace labeled V(n004)-V(n006) depicts drain-source voltage of Q4, and the trace labeled Id(M4) depicts the drain current of Q4. The trace labeled I(R3) depicts the output load current. As can be seen from the diagrams maximum current can be delivered to the load when the phase between the input signals is −90 degrees. The ideal quasi-class-E waveforms are present in each case.

Assuming the balun transformer turns ratios are 1:1 throughout the circuit, the nominal component values for operation of this circuit may be found from the following equations.

$$PEP\ output = 6.82 * B^2/R$$

$$C1,\ C2,\ C3,\ C4 = 3.0/(2\pi * F * R)$$

$$L1,\ L2 = 0.33 * R/(2\pi * F)$$

$$RFC > 2 * L1$$

where:

F is the operating frequency of the power amplifier,

B is the power supply voltage.

Where the balun turns ratios are not 1:1, the equations above will be scaled by the square of the turns ratio where appropriate.

It is recognized that the characteristic body diode conduction that is exploited on transistors Q3 and Q4 during output modulation is not a feature possessed of all power semiconductor devices. To allow application of devices such as MESFETs that do not allow reverse drain-source conduction without the presence of gate drive, the drain-source terminals of the Q3-Q4 devices may be shunted by a passive rectifier device such as a Shottky diode to permit this current flow.

It is recognized that alternate implementations of the invention may be provided. The push-pull power amplifier and dual-switch load modulation circuit may be replaced by single-switch circuits, which, while simplifying the circuit, suffer from second-harmonic generation. Additionally, alternate classes of power amplifier, such as Class-D or Class-F may be employed as the power amplifier of the invention.

Those skilled in the art will realize that the process sequences described above may be equivalently performed in any order to achieve a desired result. Also, sub-processes may typically be omitted as desired without taking away from the overall functionality of the processes described above.

The invention claimed is:

1. A high-efficiency LINC PA comprising:
    a balanced pi network;
    a balanced class-E amplifier; and
    a balanced modulated load network coupled to the balanced class-E amplifier by the balanced pi network,
    wherein the balanced pi network further includes a parallel amplifier capacitance coupled to a first terminal pair of a parallel inductance and a parallel modulated load capacitance coupled to a second terminal pair of a parallel inductance.

2. The high-efficiency LINC PA of claim 1 in which the amplifier capacitance includes a parasitic capacitance.

3. The high-efficiency LINC PA of claim 1 in which the modulated load capacitance includes a parasitic capacitance.

4. The high-efficiency LINC PA of claim 1 in which the balanced class-E amplifier includes transistors parallel coupled to the parallel amplifier capacitance.

5. The high-efficiency LINC PA of claim 4 in which the transistors are MOSFETS.

6. The high-efficiency LINC PA of claim 4 in which the transistors are bipolar transistors.

7. The high-efficiency LINC PA of claim 4 in which the transistors are MESFETs parallel coupled to a passive rectifier.

8. The high-efficiency LINC PA of claim 7 in which the modulated load capacitance is parallel coupled to MOSFET transistors.

* * * * *